(12) United States Patent
Wang et al.

(10) Patent No.: US 11,196,025 B2
(45) Date of Patent: Dec. 7, 2021

(54) ORGANIC LIGHT-EMITTING DIODE (OLED) DISPLAY PANEL HAVING A RING-SHAPED BARRIER, MANUFACTURING METHOD THEREOF, AND OLED DISPLAY DEVICE HAVING THE SAME

(71) Applicant: WUHAN CHINA STAR OPTOELECTRONICS SEMICONDUCTOR DISPLAY TECHNOLOGY CO., LTD., Wuhan (CN)

(72) Inventors: Yijia Wang, Wuhan (CN); Jun Cao, Wuhan (CN)

( * ) Notice: Subject to any disclaimer, the term of this patent is extended or adjusted under 35 U.S.C. 154(b) by 411 days.

(21) Appl. No.: 16/327,831

(22) PCT Filed: Dec. 27, 2018

(86) PCT No.: PCT/CN2018/124511
§ 371 (c)(1),
(2) Date: Feb. 24, 2019

(87) PCT Pub. No.: WO2020/082592
PCT Pub. Date: Apr. 30, 2020

(65) Prior Publication Data
US 2021/0184172 A1    Jun. 17, 2021

(30) Foreign Application Priority Data
Oct. 26, 2018    (CN) .......................... 201811259000.8

(51) Int. Cl.
*H01L 29/08*    (2006.01)
*H01L 51/52*    (2006.01)
(Continued)

(52) U.S. Cl.
CPC .......... *H01L 51/5256* (2013.01); *H01L 51/56* (2013.01); *H01L 27/3246* (2013.01); *H01L 27/3258* (2013.01); *H01L 2227/323* (2013.01)

(58) Field of Classification Search
CPC . H01L 51/56; H01L 51/5256; H01L 27/3246; H01L 27/3258; H01L 2227/323
See application file for complete search history.

(56) References Cited

U.S. PATENT DOCUMENTS

2014/0339516 A1* 11/2014 Hu ....................... H01L 51/5246
257/40
2016/0268547 A1* 9/2016 Kim .................... H01L 51/5256
(Continued)

FOREIGN PATENT DOCUMENTS

| CN | 105914224 A | 8/2016 |
|---|---|---|
| CN | 106848107 A | 6/2017 |

(Continued)

*Primary Examiner* — Phuc T Dang

(57) ABSTRACT

An organic light emitting diode (OLED) display panel and a manufacturing method thereof, an OLED display device are provided, including a display area and a non-display area surrounding the display area, where the OLED display panel also includes at least one ring-shaped barrier protruding from a surface of one side of the non-display area and surrounds the display area and at least one recess recessed on a top surface of the barrier. A cross-sectional shape of the recess includes, but is not limited to, a trapezoidal shape, an arc shape, or a V shape. The manufacturing method of the OLED display panel includes a substrate providing step, a barrier forming step, an exposure development step, and an imprinting step. The OLED display device includes the OLED display panel of any of the above.

8 Claims, 11 Drawing Sheets

(51) Int. Cl.
*H01L 51/56* (2006.01)
*H01L 27/32* (2006.01)

(56) References Cited

U.S. PATENT DOCUMENTS

2017/0199430 A1* 7/2017 Huang .................. G02F 1/1339
2017/0294623 A1* 10/2017 Gai ..................... H01L 27/3244
2020/0028114 A1* 1/2020 Zhai ..................... H01L 27/323

FOREIGN PATENT DOCUMENTS

| CN | 206976349 U | 2/2018 |
| CN | 207719213 U | 8/2018 |

* cited by examiner

ORGANIC LIGHT-EMITTING DIODE (OLED) DISPLAY PANEL HAVING A RING-SHAPED BARRIER, MANUFACTURING METHOD THEREOF, AND OLED DISPLAY DEVICE HAVING THE SAME

FIELD OF DISCLOSURE

The present disclosure relates to the field of display technologies, and more particularly to an organic light emitting diode (OLED) display panel and a manufacturing method thereof, and an OLED display device.

BACKGROUND

Organic light emitting diode (OLED) displays are currently a popular direction of development in the display industry due to its low power consumption, high resolution, fast response, and bendability. Regarding a thin film encapsulation design of an OLED flexible panel, an organic/inorganic film layer overlapping structure is generally used to achieve purposes of blocking water and oxygen, particle coating, stress relieving, and the like.

Because an electrode and an organic layer of the OLED are easily corroded by water and oxygen, their lifespan is reduced, so an active-matrix organic light emitting diode (AMOLED) display panel needs to be encapsulated. In prior art, for a flexible display, thin film encapsulation (TFE) is one of the most commonly used encapsulation methods.

At present, a manufacturing process of an organic film layer of thin film encapsulation is generally deposited by plasma-enhanced chemical vapor deposition (PECVD), atomic layer deposition (ALD), pulsed laser deposition (PLD), ink-jet printing (IJP) and other processes. As shown in FIG. 1, in order to prevent an organic layer from flowing out of a coverage area of an inorganic layer, a barrier 11 is often designed. However, during the process, a bonding force between the barrier 11 and the inorganic film layer 12 is poor, which causes the barrier 11 to peel off, so that the organic layer occasionally overflows the coverage area of the inorganic layer.

SUMMARY OF THE DISCLOSURE

An object of the disclosure is to provide an OLED display panel and a manufacturing method thereof, which can effectively solve a technical problem that a bonding force between a barrier and an inorganic layer of the OLED display panel is poor, and the peeling phenomenon occurs.

The present disclosure provides an organic light-emitting diode (OLED) display panel, including: a display area, a non-display area surrounding the display area, and an OLED substrate, and also including at least one ring-shaped barrier and at least one recess. The ring-shaped barrier protrudes from a surface of one side of the OLED substrate, where the ring-shaped barrier is positioned in the non-display area, and surrounds the display area. The recess is recessed on a top surface of the ring-shaped barrier.

Furthermore, a cross-sectional shape of the recess includes, but is not limited to, a trapezoidal shape, an arc shape, or a V shape. The ring-shaped barrier is formed by two or more curved portions or tooth profile portions connected end to end.

Furthermore, a planarization layer, a pixel definition layer, a luminous area, and a thin film encapsulation layer are sequentially attached to one side of the OLED substrate; and the ring-shaped barrier and the planarization layer are disposed on the same side of the OLED substrate.

Furthermore, the thin film encapsulation layer includes: two or more inorganic layers; and at least one organic layer disposed in a gap between any two adjacent inorganic layers, where two sides of each organic layer are correspondingly attached to sides of the two adjacent inorganic layers; and each organic layer is surrounded by the ring-shaped barrier.

In order to solve the above technical problem, the present disclosure also provides a manufacturing method of an organic light-emitting diode (OLED) display panel, including: a substrate providing step of providing an OLED substrate; a barrier forming step of forming at least one ring-shaped barrier on the surface of the OLED substrate, where the ring-shaped barrier is positioned in a non-display area, and surrounds a display area; an exposure development step of performing ultraviolet light irradiation and development treatment on the ring-shaped barrier; and an imprinting step of imprinting at least one recess on a top surface of the ring-shaped barrier.

Furthermore, after the exposure development step, the method further includes: a display area device forming step of forming a planarization layer, a pixel definition layer, and a luminous area on the OLED substrate, where the ring-shaped barrier and the planarization layer are disposed on the same side of the OLED substrate.

Furthermore, after the imprinting step, the method further includes: a thin film encapsulation step of sequentially forming two or more inorganic layers and at least one organic layer on the OLED substrate, where each organic layer is disposed between any two adjacent inorganic layers.

Furthermore, after the thin film encapsulation step, the method further includes: a first inorganic layer forming step of forming an inorganic layer on a surface of a substrate; an organic layer forming step of forming an organic layer on the inorganic layer; a second inorganic layer forming step of forming another inorganic layer on the organic layer; and repeating 2 to 4 times the organic layer forming step and the second inorganic layer forming step, where each of the organic layers is surrounded by the ring-shaped barrier.

Furthermore, material of the ring-shaped barrier includes parylene polymer.

In order to solve the above technical problem, the present disclosure also provides an organic light-emitting diode (OLED) display device includes the OLED display panel described above.

The present disclosure provides an OLED display panel and a manufacturing method thereof, and an OLED display device, which increases a contact area of the ring-shaped barrier and the inorganic layer by designing an existing ring-shaped barrier into a shape composed of a plurality of tooth profile portions and curved portions. Moreover, a plurality of recesses are formed on a top of the ring-shaped barrier, which increases the contact area between the barrier and the inorganic layer, thereby increasing the bonding force between the barrier and the inorganic layer, and reducing a risk of peeling off of the inorganic layer.

BRIEF DESCRIPTION OF THE DRAWINGS

In order to more clearly describe the technical solutions of the embodiments of the present disclosure, accompanying drawings to be used in the detailed description of the disclosure will be briefly described hereinbelow. Obviously, the accompanying drawings described hereinbelow only illustrate some of the embodiments of the present disclosure, and those of ordinary skill in the art can also obtain other accompanying drawings therefrom without the need of making inventive efforts.

DETAILED DESCRIPTION

Figure 1:
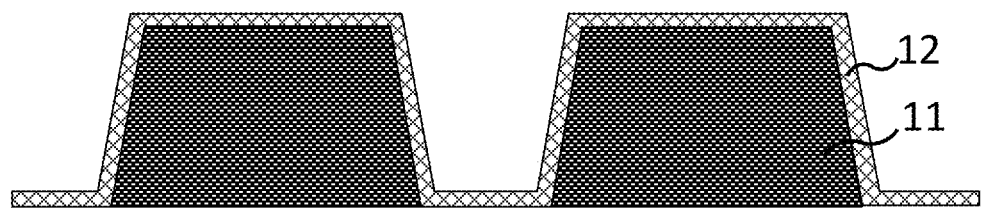
FIG. 1 is a schematic diagram of a barrier and an inorganic layer of prior art.

The following embodiments refer to the accompanying drawings for exemplifying specific implementable embodiments of the present disclosure. Moreover, directional terms described by the present disclosure, such as upper, lower, front, back, left, right, inner, outer, side, etc., are only directions by referring to the accompanying drawings. The terms first, second, etc. are only used to distinguish one element from another, and can be better expressed. In the drawings, the same reference symbol represents the same or similar components.

The following illustration referring to the drawings explains the details of each exemplary embodiment of the present disclosure. However, more than one way could implement the present disclosure. As such, it is to be clarified that the exemplary embodiments are used for purposes of illustration that could help other technical staff understand the principle as well as various modifications due to specific targets, rather than being regarded as limits.

First Embodiment

Figure 2:
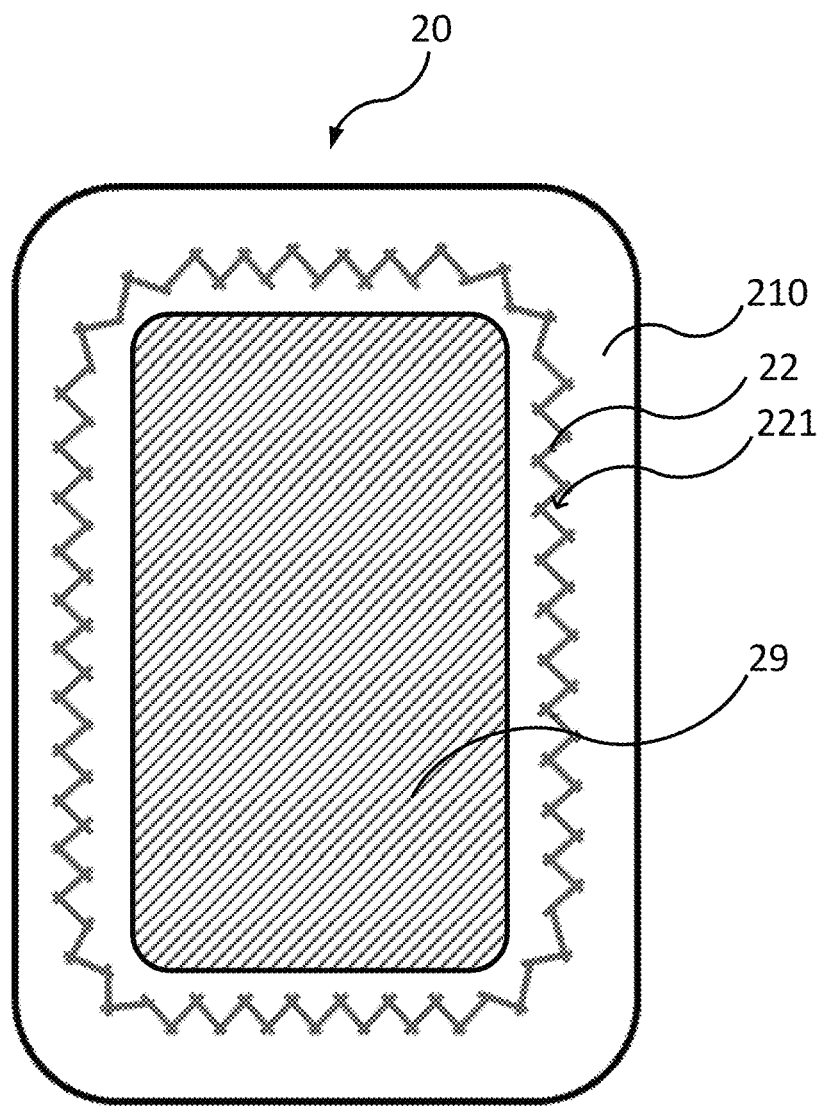
FIG. 2 is a schematic diagram of an organic light emitting diode (OLED) display panel of a first embodiment of the present disclosure.
Figure 3:
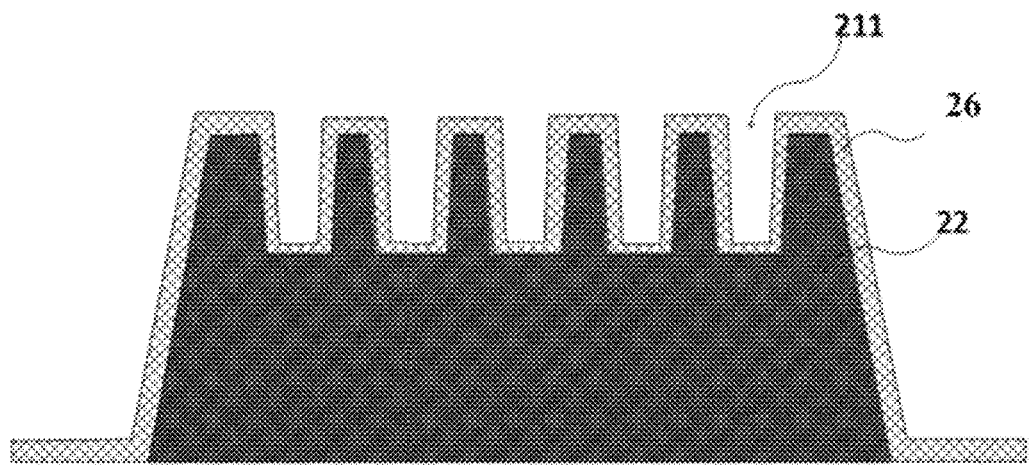
FIG. 3 is a longitudinal sectional view of a ring-shaped barrier of the first embodiment of the present disclosure.
Figure 4:
FIG. 4 is a longitudinal sectional view of a substrate of the first embodiment of the present disclosure.
Figure 5:
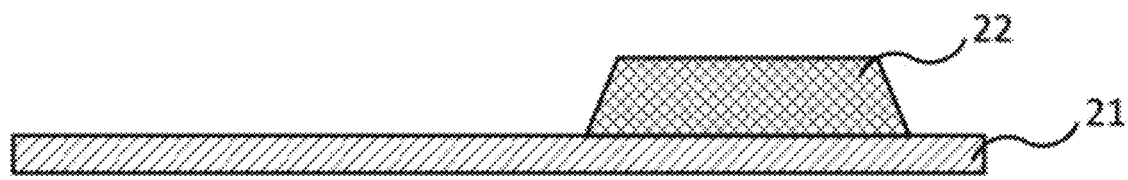
FIG. 5 is a longitudinal sectional view of the substrate and the ring-shaped barrier of the first embodiment of the present disclosure.
Figure 6:
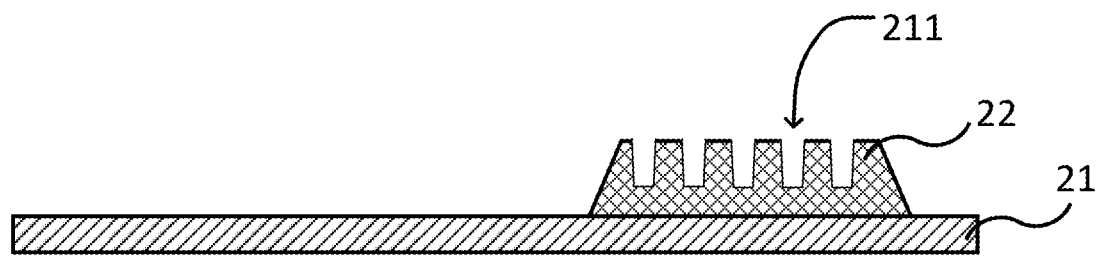
FIG. 6 is a schematic diagram showing the ring-shaped barrier of the first embodiment of the present disclosure after it is imprinted.
Figure 7:
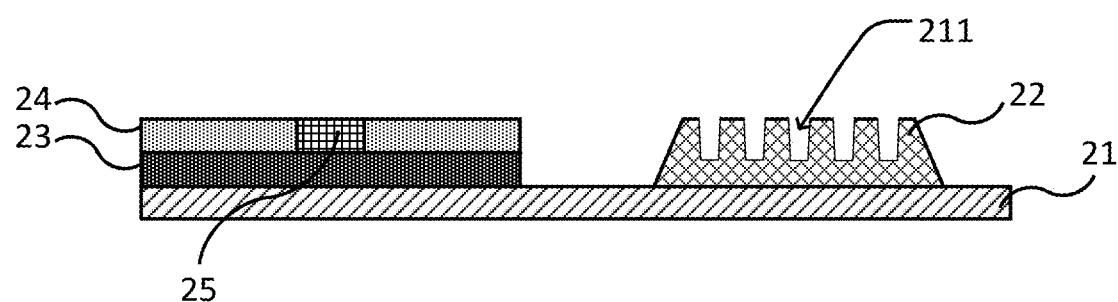
FIG. 7 is a longitudinal sectional view of the substrate, the barrier, and a display area device of the first embodiment of the present disclosure.
Figure 8:
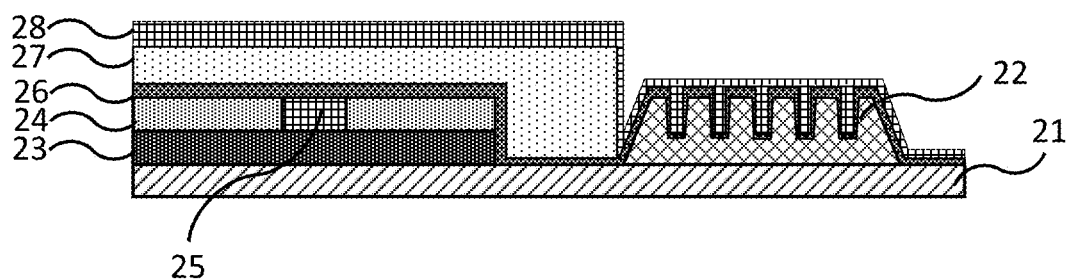
FIG. 8 is a schematic diagram of a thin film encapsulation of the OLED display panel of the first embodiment of the present disclosure.

As shown in FIG. 2, the present first embodiment provides an organic light emitting diode (OLED) display panel 20, which includes a display area 29 and a non-display area 210. The non-display area 210 surrounds the display area 29.

The OLED display panel 20 includes an OLED substrate 21, and a planarization layer 23, a pixel definition layer 24, a luminous area 25, and a thin film encapsulation layer are sequentially attached to a central portion of one side of the OLED substrate 21.

The display area 29 includes the planarization layer 23, the pixel definition layer 24, the luminous area 25, and a thin film encapsulation layer structure of the middle and part of the OLED substrate 21. The non-display area 210 includes a portion other than the display area 29 of the OLED display panel 20.

The OLED display panel 20 further includes at least one ring-shaped barrier 22 and at least one recess 211. In this embodiment, one ring-shaped barrier 22 and five recesses 211 are preferred, and the ring-shaped barrier 22 protrudes from a surface of the OLED substrate 21. The ring-shaped barrier 22 is positioned on the non-display area 210 and surrounds the display area 29. The ring-shaped barrier 22 and the planarization layer 23 are disposed on the same side of the OLED substrate 21.

The thin film encapsulation layer includes two or more inorganic layers and at least one organic layer disposed in a gap between any two adjacent inorganic layers, where two sides of each organic layer are correspondingly attached to sides of two adjacent inorganic layers. Each organic layer is surrounded by the ring-shaped barrier. In this embodiment, a double-layer inorganic layer and a single-layer organic film are provided, including a first inorganic layer 26, an organic layer 27, and a second inorganic layer 28. The first inorganic layer 26 is attached to a surface of the pixel definition layer 24 and the ring-shaped barrier 22 away from the substrate 21. The organic layer 27 is attached to a side of the first inorganic layer 26 away from the substrate 21. The organic layer 27 is surrounded by the ring-shaped barrier 22. The second inorganic layer 28 is attached to a surface of the organic layer 27 and the first inorganic layer 26 away from the substrate 21. The ring-shaped barrier 22 can prevent the organic layer 27 from overflowing during coating, and thereby better forming the organic layer 27.

The recess 211 is recessed on a top surface of the ring-shape barrier 22. The cross-sectional shape of the recess 221 includes, but is not limited to, a trapezoidal shape, an arc shape, or a V shape. In this embodiment, a trapezoidal cross section is preferred. In this embodiment, the recess 211 is used to increase a contact area between the ring-shape barrier 22 and the first inorganic layer 26 during the fabrication of the OLED panel, and increase a bonding force between the ring-shape barrier 22 and the first inorganic layer 26, thereby effectively reducing a risk of peeling off of the ring-shape barrier 22.

The ring-shape barrier 22 is formed by two or more tooth profile portions 221 connected end to end. In this embodiment, the existing rectangular ring-shape barrier is designed into a shape formed by a plurality of tooth profile portions, which increases a length of the entire ring-shape barrier, thereby increasing the contact area between the ring-shape barrier and the inorganic layer. Furthermore, the bonding force is increased, and the risk of peeling off of the ring-shape barrier 22 is reduced.

Figure 9:
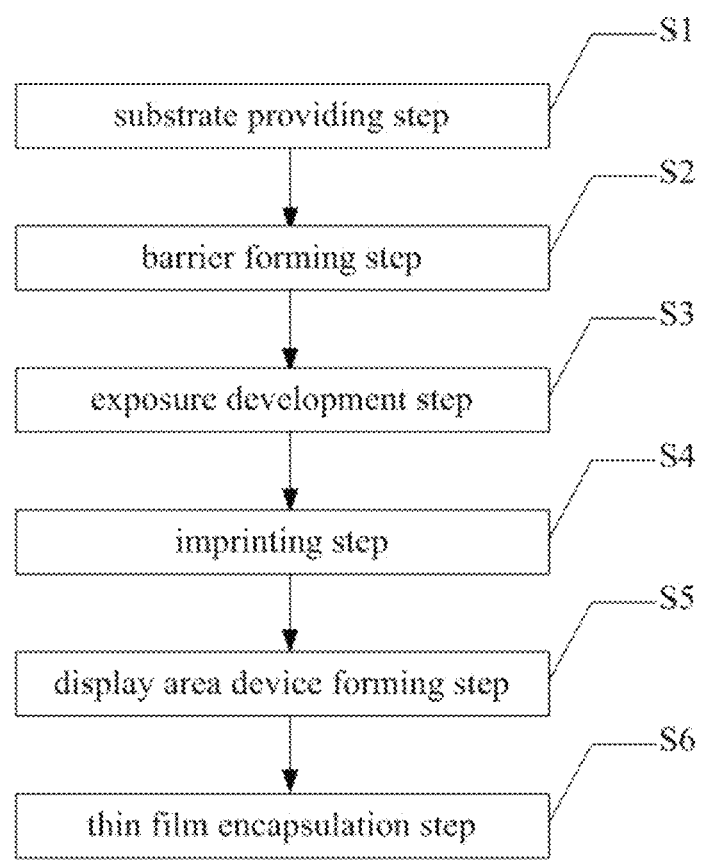
FIG. 9 is a flowchart of a manufacturing method of an OLED display panel of the first embodiment of the present disclosure.

As shown in FIG. 4 to FIG. 8, in order to obtain the OLED display panel, the first embodiment provides a manufacturing method of the OLED display panel. As shown in FIG. 9, the following steps of S1 to S6 are included.

In S1, a substrate providing step, an OLED substrate 21 is provided. The OLED substrate 21 mainly includes a glass or PI substrate and a driving circuit.

In S2, a barrier forming step, at least one ring-shaped barrier 22 is formed on the OLED substrate 21. The ring-shaped barrier 22 protrudes from the surface of one side of the non-display area and surrounds the display area. In this embodiment, one ring-shaped barrier 22 is preferred. Material of the ring-shaped barrier is a type of parylene polymer (PDL), including Parylene C, Parylene N, Parylene AF4, Parylene AF8. Preferably, the material is Parylene C.

In S3, an exposure development step, ultraviolet light irradiation and development treatment are performed on the ring-shaped barrier 22. The ring-shaped barrier 22 formed by a plurality of tooth profile portions connected end to end can be obtained. The barrier presented in this embodiment includes, but is not limited to, a pattern of a bend line, an arc, and etc. In the exposure development step, the ring-shaped barrier 22, the planarization layer 23, and the pixel definition layer 24 may be simultaneously subjected to ultraviolet light irradiation and development treatment. The ring-shaped barrier 22 is a ring formed by two or more tooth profile portions connected end to end.

In S4, an imprinting step, at least one recess 211 is imprinted on a top surface of the ring-shaped barrier 22. The recess 211 is evenly distributed on top of the ring-shaped barrier 22. A shape of the imprinted recess includes, but is not limited to, a trapezoidal shape, an arc shape, or a V shape, etc. In the embodiment, a trapezoid is preferred.

In S5, a display area device forming step, a planarization layer 23, a pixel definition layer 24, and a luminous area 25 are sequentially formed on the OLED substrate, where the ring-shaped barrier 22 and the planarization layer 23 are disposed on the same side of the OLED substrate 21. The luminous area 25 includes an anode, a hole injection/transport layer, a light-emitting layer, an electron transport/injection layer, a cathode, and the like.

In S6, a thin film encapsulation step, two or more inorganic layers and at least one organic layer are sequentially formed on the OLED substrate 21. Each organic layer is disposed between any two adjacent inorganic layers. The first inorganic layer 26, the organic layer 27, and the second inorganic layer 28 are included in this embodiment. Specifically, the method includes the following steps: a first inorganic layer forming step of forming an inorganic layer on an upper surface of the substrate, an organic layer forming step of forming an organic layer on an upper surface of the inorganic layer, and a second inorganic layer forming step of forming another inorganic layer on an upper surface of the organic layer, and the organic layer forming step and the second inorganic layer forming step are repeated 2 to 4 times. In the present embodiment, it is repeated once, and in other embodiments, it may be 3 or 4 times. Moreover, each organic layer 27 is surrounded by the ring-shaped barrier.

Specifically, the first inorganic layer 26 is attached to a surface of the pixel definition layer 24 and the ring-shape barrier 22 away from the substrate 21. The organic layer 27 is attached to a side of the first inorganic layer 26 away from the substrate 21. The organic layer 27 is surrounded by the ring-shape barrier 22. The second inorganic layer 28 attaches a surface of the organic layer 27 and the first inorganic layer 26 away from the substrate 21. A material of the inorganic layer may be SiNx, SiOxNy, SiOx, SiCNx, AlOx, TiOx or the like which having water and oxygen blocking properties, and the inorganic layer may be formed by a process such as PECVD, ALD, PLD, and sputter. A material of the organic layer 27 may be Acrylate, HMDSO, polyacrylate, polycarbonate, polystyrene, and the organic layer 27 may be formed by a process such as IJP, Dispenser, or the like.

In order to better apply the OLED display panel technology, the present disclosure also provides a display device including the flexible display panel described above, and the display device can be an electronic device such as a mobile phone, a tablet, or a notebook.

In the manufacturing method of the OLED display panel, this embodiment provides a plurality of recesses formed on the top surface of the ring-shape barrier to increase the contact area between the ring-shape barrier 22 and the first inorganic layer 26, and increase the bonding force between the ring-shape barrier 22 and the first inorganic layer 26, thereby effectively reducing a risk of peeling off of the first inorganic layer 26.

Furthermore, the ring-shape barrier 22 is formed by tooth profile portions 221 connected end to end, which increases an entire length of the ring-shape barrier 22, thereby increasing the contact area between the ring-shape barrier 22 and the first inorganic layer 26, increasing the bonding force of the ring-shape barrier 22 and the first inorganic layer 26, and reducing a risk of peeling off of the first inorganic layer 26.

Second Embodiment

Figure 10:
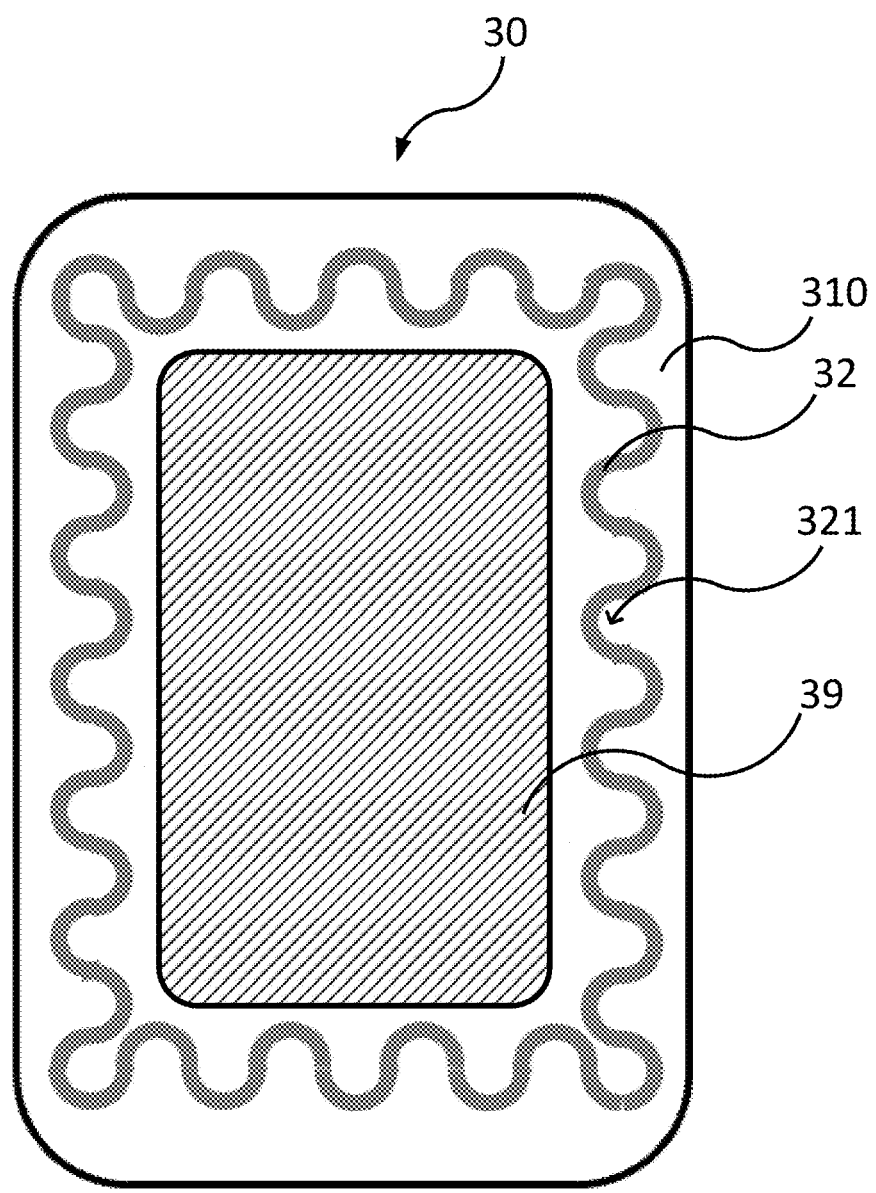
FIG. 10 is a schematic diagram of an OLED display panel of a second embodiment of the present disclosure.

As shown in FIG. 10, the present disclosure further provides a second embodiment, which includes a majority of the technical solutions of the first embodiment, the difference between the two is that the ring-shaped barrier 32 is formed by two or more curved portions 321 connected end to end. The shape of the curved portion 321 can be a sinusoidal waveform or a wave shape. In this embodiment, the sinusoidal waveform is preferred.

The length of the ring-shaped barrier 32 of the second embodiment is greater than the length of the ring-shaped barrier 22 of the first embodiment, such that a contact area between the ring-shaped barrier 32 and a first inorganic layer is increased, which increases a bonding force of the ring-shaped barrier 32 and the first inorganic layer, and reduces a risk of peeling off of the first inorganic layer.

The manufacturing method of the OLED panel of the second embodiment is mostly the same as that of the first embodiment, and the difference between the two is that, in the exposure development step, the ring-shaped barrier 32 can be obtained by performing the ultraviolet light irradiation and development treatment. The ring-shaped barrier 32 is formed by curved portions connected end to end.

The recess is used to increase the contact area between the barrier 32 and the first inorganic layer during the fabrication of the OLED panel, and increase the bonding force between the barrier 32 and the first inorganic layer, which can effectively reduce the risk of peeling off of the first inorganic layer.

Third Embodiment

Figure 11:
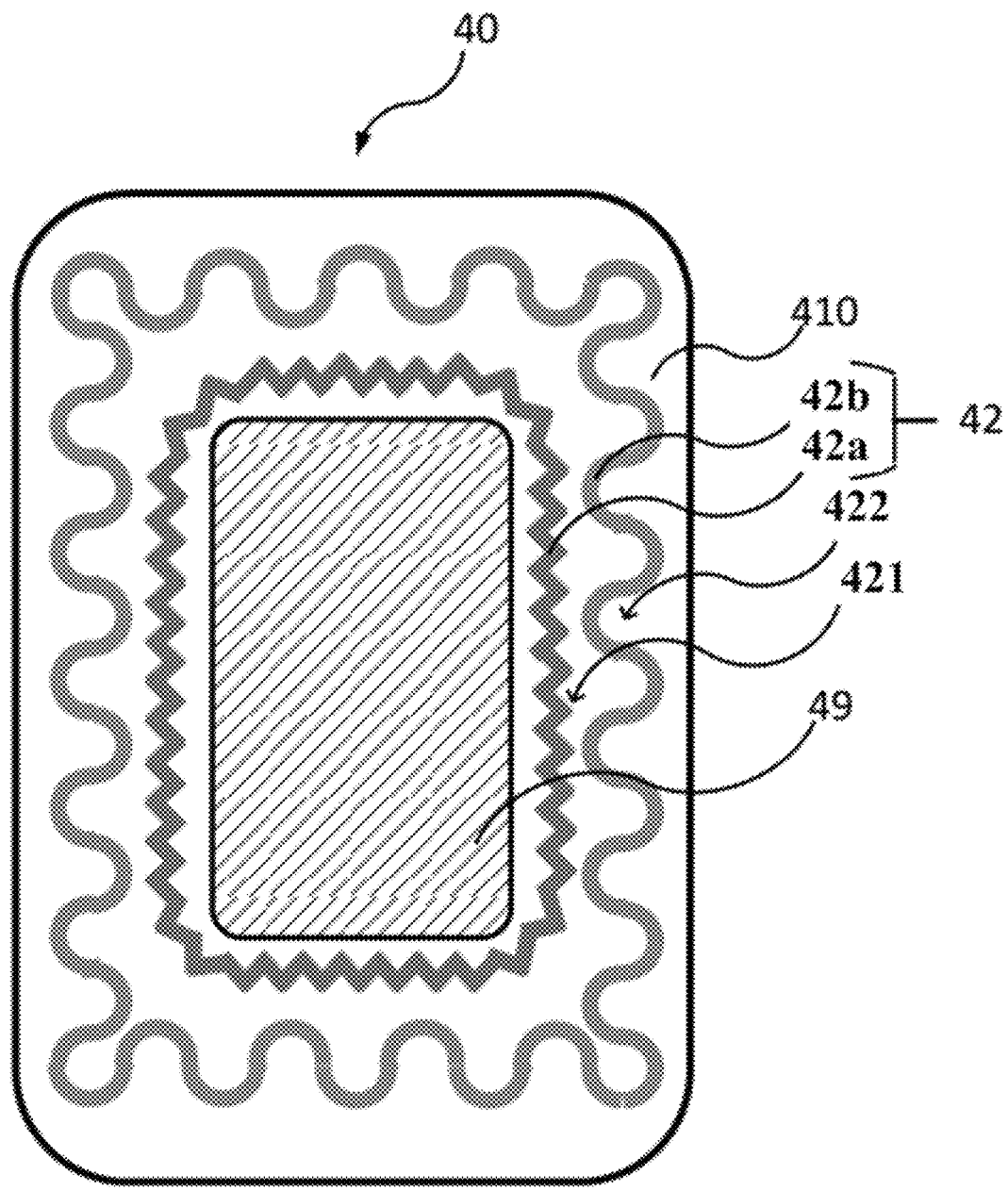
FIG. 11 is a schematic diagram of an OLED display panel of a third embodiment of the present disclosure.
Figure 12:
FIG. 12 is a longitudinal sectional view of a substrate of the third embodiment of the present disclosure.
Figure 13:
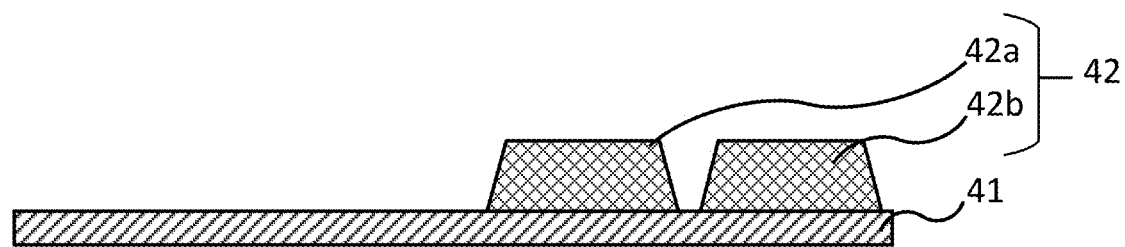
FIG. 13 is a longitudinal sectional view of the substrate and a ring-shaped barrier of the third embodiment of the present disclosure.
Figure 14:
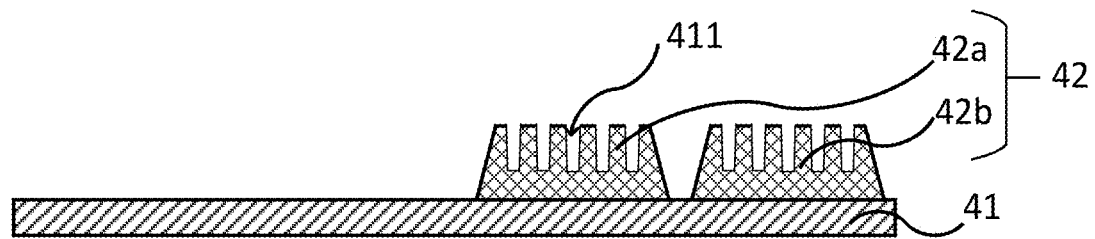
FIG. 14 is a schematic diagram showing the ring-shaped barrier of the third embodiment of the present disclosure after it is imprinted.
Figure 15:
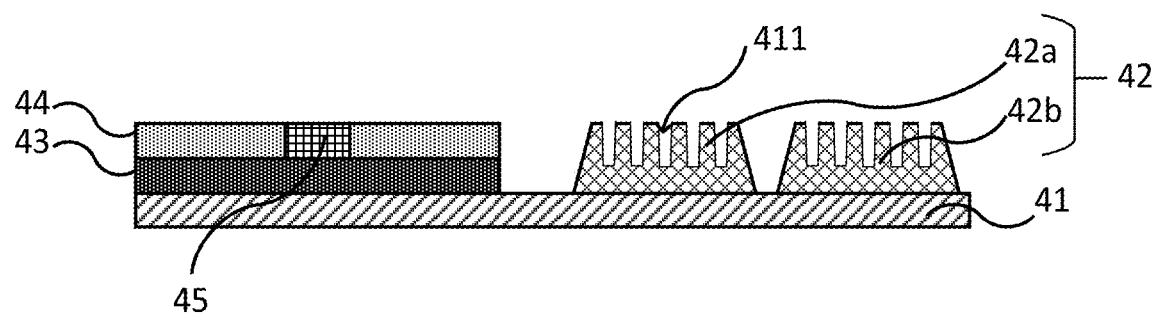
FIG. 15 is a longitudinal sectional view of the substrate, the ring-shaped barrier, and a display area device of the third embodiment of the present disclosure.
Figure 16:
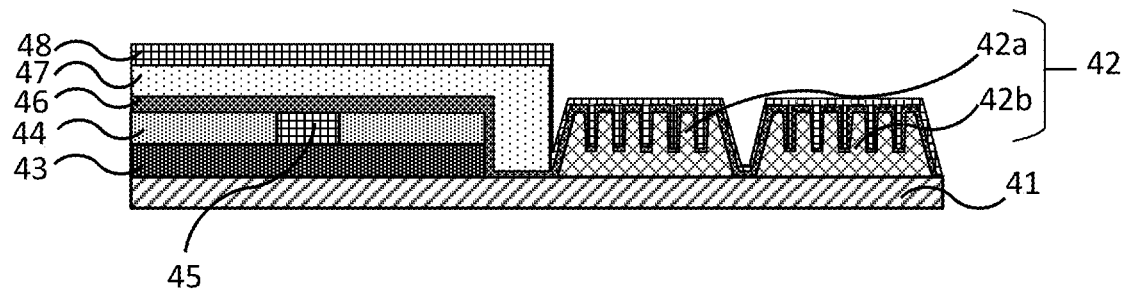
FIG. 16 is a schematic diagram of a thin film encapsulation of the OLED display panel of the third embodiment of the present disclosure.

As shown in FIG. 11, the present disclosure also provides a third embodiment, which includes most of the technical solutions of the first embodiment, and the difference between the two is that the number of ring-shape barriers provided in the third embodiment is two. The barrier assembly 42 includes a first ring-shape barrier 42a and a second ring-shape barrier 42b. The first ring-shape barrier 42a surrounds a display area 49 of a substrate 41. The second ring-shape barrier 42b surrounds the first ring-shape barrier 42a. The first ring-shape barrier 42a is formed by two or more tooth profile portions that are connected end to end. The second ring-shape barrier 42b is formed by two or more curved portions connected end to end.

A plurality of recesses 411 are disposed on the first ring-shaped barrier 42a and the second ring-shaped barrier 42b. The shape of the recess 411 includes, but is not limited to, a trapezoidal shape, an arc shape, or a V shape, and the like. In comparison with the first embodiment, a contact area between the ring-shaped barriers 42 and the first inorganic layer 46 of the third embodiment is increased, thereby increasing a bonding force between the ring-shaped barriers 42 and the inorganic layer 46, and reducing the risk of peeling off.

In this embodiment, by adding one more ring-shaped barrier, the number of the recesses 411 is increased, thereby increasing the contact area between the ring-shaped barriers 42 and the first inorganic layer 46, increasing the bonding force between the ring-shaped barriers 42 and the first inorganic layer 46, and effectively reducing the risk of peeling off of the first inorganic layer 46.

As shown in FIG. 12 to FIG. 16, in order to obtain the OLED display panel of the third embodiment, the embodiment provides a manufacturing method of the OLED display panel. As shown in FIG. 9, the following steps S1 to S6 are included.

In S1, a substrate providing step, an OLED substrate 41 is provided. The OLED substrate 41 mainly includes a glass or PI substrate and a driving circuit.

In S2, a barrier forming step, a first ring-shaped barrier 42a and a second ring-shaped barrier 42b are formed on the OLED substrate. The ring-shaped barriers 42 protrude from a surface of one side of a non-display area. The first ring-shaped barrier 42a surrounds a display area. The second ring-shaped barrier 42b surrounds the first ring-shaped barrier 42a. Material of the ring-shaped barriers 42 is a type of parylene polymer (PDL), including Parylene C, Parylene N, Parylene AF4, Parylene AF8. Preferably, the material is Parylene C.

In S3, an exposure development step, ultraviolet light irradiation and development treatment are performed on the ring-shaped barriers 42. The first ring-shaped barrier 42a, formed by a plurality of curved portions connected end to end, can be obtained. The second ring-shaped barrier 42b formed by a plurality of tooth profile portions connected end to end can be obtained.

In S4, an imprinting step, at least one recess 411 is imprinted on a top surface of the ring-shaped barriers 42. The number and size of the recesses 411 on top of the first ring-shaped barrier 42a and the second ring-shaped barrier 42b are the same. The recesses 411 are evenly distributed on the top of the ring-shaped barriers 42. A shape of the imprinted recess includes, but is not limited to, a trapezoidal shape, an arc shape, or a V shape, etc. In the embodiment, a trapezoid is preferred.

In S5, a display area device forming step, a planarization layer 43, a pixel definition layer 44, and a luminous area 45 are sequentially formed on the OLED substrate, where the ring-shaped barriers 42 and the planarization layer 43 are disposed on the same side of the OLED substrate 41. The luminous area 45 includes an anode, a hole injection/ transport layer, a light-emitting layer, an electron transport/ injection layer, a cathode, and the like.

In S6, a thin film encapsulation step, two or more inorganic layers and at least one organic layer are sequentially formed on the OLED substrate 41. Each organic layer is disposed between any two adjacent inorganic layers. The first inorganic layer 46, the organic layer 47, and the second inorganic layer 48 are included in this embodiment. Specifically, the method includes the following steps: a first inorganic layer forming step of forming an inorganic layer on an upper surface of the substrate, an organic layer forming step of forming an organic layer on an upper surface of the inorganic layer, and a second inorganic layer forming step of forming another inorganic layer on an upper surface of the organic layer, and the organic layer forming step and the second inorganic layer forming step are repeated 2 to 4 times. In the present embodiment, it is repeated once. Moreover, each organic layer is surrounded by the ring-shaped barriers.

Specifically, the first inorganic layer 46 is attached to a surface of the pixel definition layer 44 and the ring-shape barriers 42 away from the substrate 41. The organic layer 47 is attached to a side of the first inorganic layer 46 away from the substrate 41. The organic layer 47 is surrounded by the ring-shape barriers 42. The second inorganic layer 48 attaches a surface of the organic layer 47 and the first inorganic layer 46 away from the substrate 41. A material of the inorganic layer may be SiNx, SiOxNy, SiOx, SiCNx, AlOx, TiOx or the like which having water and oxygen blocking properties, and the inorganic layer may be formed by a process such as PECVD, ALD, PLD, and sputter. A material of the organic layer 47 may be Acrylate, HMDSO, polyacrylate, polycarbonate, polystyrene, and the organic layer may be formed by a process such as IJP, Dispenser, or the like.

In the third embodiment, two of ring-shaped barriers are provided to increase the contact area between the ring-shaped barriers 42 and the first inorganic layer 46, and increase the bonding force between the ring-shaped barriers 42 and the first inorganic layer 46, which can effectively reduce the risk of peeling off of the first inorganic layer 46.

Furthermore, in this embodiment, the shape of the first ring-shaped barrier 42a is designed as a ring shape formed by a plurality of tooth profile portions 421 connected end to end, and the shape of the second ring-shaped barrier 42b is designed as a ring shape formed by a plurality of curved portions 422 connected end to end, such that an overall length of the ring-shaped barriers 42 is increased, thereby increasing the contact area between the ring-shaped barriers 42 and the first inorganic layer 46, increasing the bonding force between the ring-shaped barriers 42 and the first inorganic layer 46, and effectively reducing the risk of peeling off of the first inorganic layer 46.

Fourth Embodiment

Figure 17:
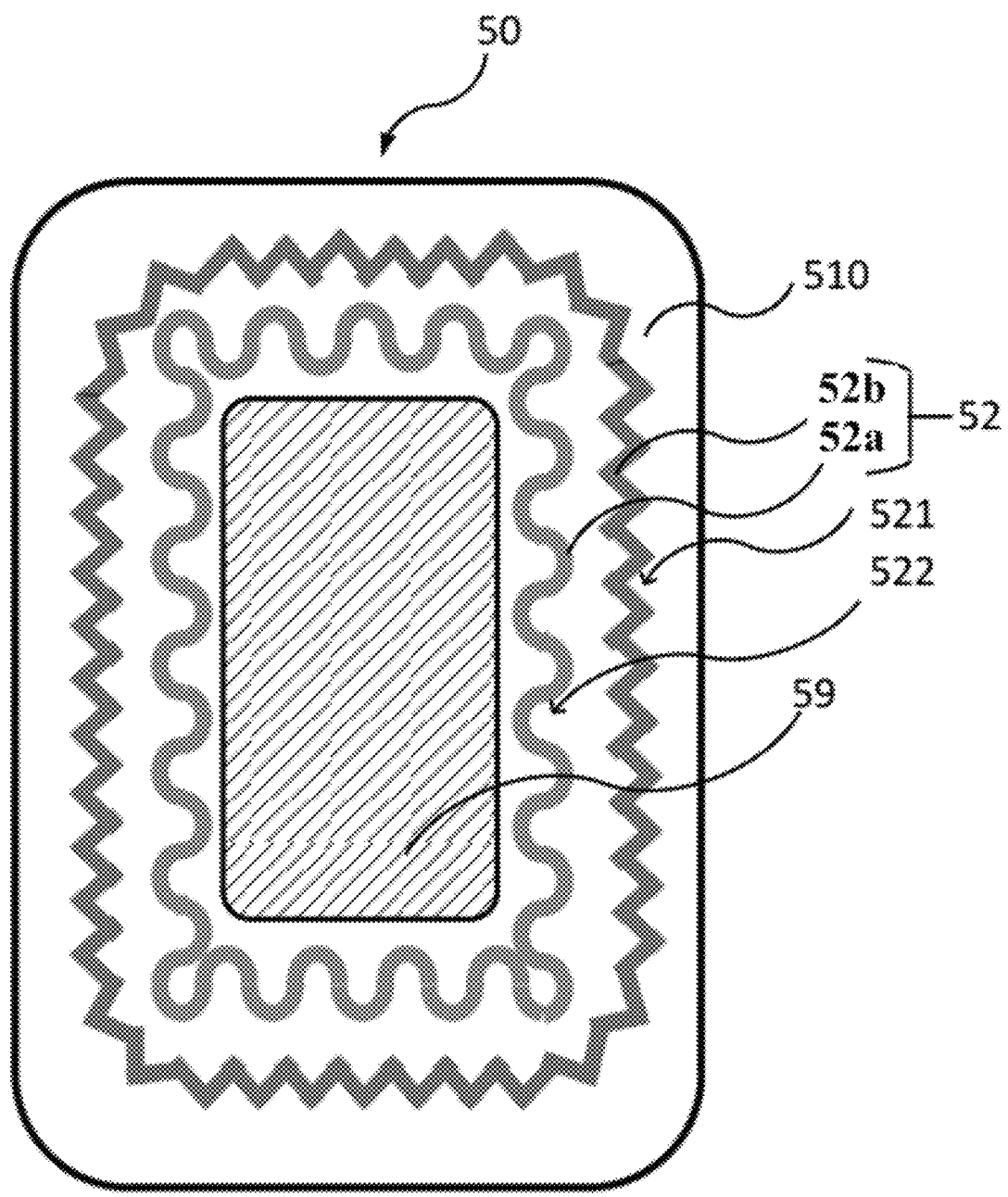
FIG. 17 is a schematic diagram of an OLED display panel of a fourth embodiment of the present disclosure.

As shown in FIG. 17, the present disclosure also provides a fourth embodiment, which includes most of the technical solutions of the third embodiment, and the difference between the two is that ring-shaped barriers 52 of the fourth embodiment include a first ring-shaped barrier 52a and a second ring-shaped barrier 52b. The first ring-shaped barrier 52a is formed by two or more curved portions connected end to end. The second ring-shaped barrier 52b is formed by two or more tooth profile portions that are connected end to end.

The first ring-shaped barrier 52a surrounds the display area 59, and the second ring-shaped barrier 52b surrounds the first ring-shaped barrier 52a.

In comparison with the third embodiment, the shape of the ring-shaped barriers of the fourth embodiment is different. In the fourth embodiment, the length of the ring-shaped barriers 52 is increased, which increases a contact area between the ring-shaped barriers 52 and the first inorganic layer, thereby increasing a bonding force, and reducing the risk of peeling off of the first inorganic layer.

Fifth Embodiment

Figure 18:
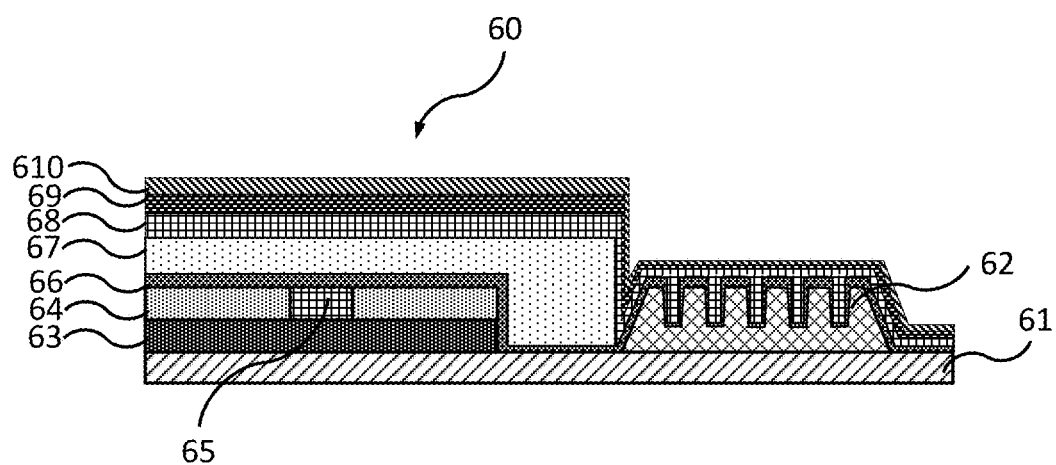
FIG. 18 is a schematic diagram of an OLED display panel of a fifth embodiment of the present disclosure.

As shown in FIG. 18, the present disclosure also provides a fifth embodiment, which includes most of the technical solutions of the first embodiment, and the difference between the two is that a thin film encapsulation layer includes two or more inorganic layers and at least one organic layer which is disposed on a gap between any two adjacent inorganic layers. Two sides of each organic layer are correspondingly attached to sides of the two adjacent organic layers. Each organic layer is surrounded by a ring-shaped barrier. In this embodiment, there are three inorganic layers and two organic layers. Specifically, they are a first inorganic layer 66, a first organic layer 67, a second inorganic layer 68, a second organic layer 69, and a third inorganic layer 610. The first inorganic layer 66 is attached to a surface of a pixel definition layer 64 and the ring-shaped barrier 62 away from the substrate 61. The first organic layer 67 is attached to the side of the first inorganic layer 66 away from the substrate 61. The first organic layer 67 is surrounded by the ring-shaped barrier 62. The second inorganic layer 68 is attached to a surface of the first organic layer 67 and the first inorganic layer 66 away from the substrate 61. The second organic layer 69 is attached to a surface of the second inorganic layer away from the substrate 61. The third inorganic layer 610 is attached to a surface of the second organic layer 69 away from the substrate 61.

A specific forming step of the thin film encapsulation is as following. Two or more inorganic layers and at least one organic layer are sequentially formed on the OLED substrate 61. Each of the organic layers is disposed between any two adjacent inorganic layers. In this embodiment, there are the first inorganic layer 66, the first organic layer 67, the second inorganic layer 68, the second organic layer 69, and the third inorganic layer 610. The method includes the following steps: a first inorganic layer forming step of forming an inorganic layer on an upper surface of the substrate, an organic layer forming step of forming an organic layer on an upper surface of the inorganic layer, a second inorganic layer forming step of forming another inorganic layer on an upper surface of the organic layer, and the organic layer forming step and the second inorganic layer forming step are repeated 2 to 4 times. In the present embodiment, it is repeated twice, and in other embodiments, it may be 3 or 4 times. Moreover, each organic layer 67 is surrounded by the ring-shaped barrier.

A thin film encapsulation structure of the fifth embodiment is an alternating interlayer structure of inorganic and organic layers, which can better protect the OLED display device and improve its service life.

The above descriptions are merely preferable embodiments of the present disclosure, and are not intended to limit the scope of the present disclosure. Any modification or replacement made by those skilled in the art without departing from the spirit and principle of the present disclosure should fall within the protection scope of the present disclosure.

What is claimed is:

1. An organic light-emitting diode (OLED) display panel, comprising:
   a display area; and
   a non-display area surrounding the display area,
   wherein the OLED display panel further comprises:
   an OLED substrate;
   at least one ring-shaped barrier protruding from a surface of one side of the OLED substrate, wherein the ring-shaped barrier is positioned in the non-display area, and surrounds the display area; and
   at least one recess recessed on a top surface of the ring-shaped barrier;
   wherein a planarization layer, a pixel definition layer, a luminous area, and a thin film encapsulation layer are sequentially attached to one side of the OLED substrate; and
   the ring-shaped barrier and the planarization layer are disposed on a same side of the OLED substrate.

2. The OLED display panel as claimed in claim 1, wherein a cross-sectional shape of the recess is a trapezoidal shape, an arc shape, or a V shape; and/or
   the ring-shaped barrier is formed by two or more curved portions or tooth profile portions connected end to end.

3. The OLED display panel as claimed in claim 1, wherein the thin film encapsulation layer comprises:
   two or more inorganic layers; and
   at least one organic layer disposed in a gap between any two adjacent inorganic layers,
   wherein two sides of each organic layer are correspondingly attached to sides of the two adjacent inorganic layers; and
   each organic layer is surrounded by the ring-shaped barrier.

4. A manufacturing method of an organic light-emitting diode (OLED) display panel, comprising:
   a substrate providing step of providing an OLED substrate;
   a barrier forming step of forming at least one ring-shaped barrier on a surface of the OLED substrate, wherein the ring-shaped barrier is positioned in a non-display area and surrounds a display area;
   an exposure development step of performing ultraviolet light irradiation and development treatment on the ring-shaped barrier; and
   an imprinting step of imprinting at least one recess on a top surface of the ring-shaped barrier.

5. The manufacturing method of an OLED display panel as claimed in claim 4, wherein after the exposure development step, the method further comprises:
   a display area device forming step of forming a planarization layer, a pixel definition layer, and a luminous area on the OLED substrate, wherein the ring-shaped barrier and the planarization layer are disposed on the same side of the OLED substrate.

6. The manufacturing method of an OLED display panel as claimed in claim 4, wherein after the imprinting step, the method further comprises:
   a thin film encapsulation step of sequentially forming two or more inorganic layers and at least one organic layer on the OLED substrate, wherein each organic layer is disposed between any two adjacent inorganic layers.

7. The manufacturing method of an OLED display panel as claimed in claim 6, wherein after the thin film encapsulation step, the method further comprises:
- a first inorganic layer forming step of forming an inorganic layer on a surface of a substrate;
- an organic layer forming step of forming an organic layer on the inorganic layer;
- a second inorganic layer forming step of forming another inorganic layer on the organic layer; and
- repeating 2 to 4 times the organic layer forming step and the second inorganic layer forming step, wherein each of the organic layers is surrounded by the ring-shaped barrier.

8. The manufacturing method of an OLED display panel as claimed in claim 4, wherein a material of the ring-shaped barrier comprises parylene polymer.

* * * * *